United States Patent
So et al.

(10) Patent No.: US 8,143,324 B2
(45) Date of Patent: Mar. 27, 2012

(54) BENZOCYCLOBUTENE BASED POLYMER FORMULATIONS AND METHODS FOR PROCESSING SUCH FORMULATIONS IN OXIDATIVE ENVIRONMENTS

(75) Inventors: Ying Hung So, Midland, MI (US);
Edmund J. Stark, Midland, MI (US);
Jack E. Hetzner, Reese, MI (US);
Shellene K. Thurston, Saginaw, MI (US)

(73) Assignee: Dow Global Technologies LLC, Midland, MI (US)

( * ) Notice: Subject to any disclaimer, the term of this patent is extended or adjusted under 35 U.S.C. 154(b) by 714 days.

(21) Appl. No.: 11/665,245

(22) PCT Filed: Oct. 12, 2005

(86) PCT No.: PCT/US2005/036452
§ 371 (c)(1),
(2), (4) Date: Jul. 15, 2009

(87) PCT Pub. No.: WO2006/044337
PCT Pub. Date: Apr. 27, 2006

(65) Prior Publication Data
US 2009/0275673 A1 Nov. 5, 2009

Related U.S. Application Data

(60) Provisional application No. 60/618,548, filed on Oct. 13, 2004.

(51) Int. Cl.
*C08F 2/50* (2006.01)
*C08F 20/22* (2006.01)
*G03F 7/029* (2006.01)
*C08K 5/34* (2006.01)
*C08K 5/00* (2006.01)
*C08K 5/13* (2006.01)
*C07F 9/40* (2006.01)

(52) U.S. Cl. ............ 522/46; 522/48; 522/182; 524/100; 524/99; 524/336; 524/101; 524/291; 524/323

(58) Field of Classification Search .................. 522/46, 522/182, 48; 524/100, 342, 99, 336, 101, 524/131, 291, 323
See application file for complete search history.

(56) References Cited

U.S. PATENT DOCUMENTS

| | | |
|---|---|---|
| 4,540,763 A | 9/1985 | Kirchhoff |
| 4,708,994 A | 11/1987 | Wong |
| 4,711,964 A | 12/1987 | Tan et al. |
| 4,724,260 A | 2/1988 | Kirchhoff et al. |
| 4,783,514 A | 11/1988 | Kirchhoff et al. |
| 4,812,588 A | 3/1989 | Schrock |
| 4,826,997 A | 5/1989 | Kirchhoff |
| 4,999,499 A | 3/1991 | Bhatt |
| 5,002,808 A | 3/1991 | Hahn |
| 5,136,069 A | 8/1992 | DeVries et al. |
| 5,138,081 A | 8/1992 | DeVries et al. |
| 5,185,391 A | 2/1993 | Stokich, Jr. |
| 5,243,068 A | 9/1993 | DeVries et al. |
| 5,449,740 A | 9/1995 | Tan et al. |
| 5,868,951 A | 2/1999 | Schuck, III et al. |
| 6,083,661 A | 7/2000 | Oaks et al. |
| 6,361,926 B1 | 3/2002 | So et al. |
| 6,593,155 B2 | 7/2003 | Mohler et al. |
| 6,596,624 B1 | 7/2003 | Romankiw |

FOREIGN PATENT DOCUMENTS

| | | |
|---|---|---|
| WO | WO 93/05866 | 4/1993 |
| WO | WO 93/12055 | 6/1993 |
| WO | WO 94/25903 | 11/1994 |

OTHER PUBLICATIONS

*Cure and Oxidation Measurements for Cyclotene Advanced Electronic Resins*, www.dow.com—printed from website Sep. 2004.
Photoreactive Polymers; *Photoinitiated Polymerization*; Wiley—Interscience Publication, 1989, pp. 102-127, 187 and 216.
*Antioxidand for Exastomer Modified Benzocyclobutene (BCB) Based Polymers*; IP.com, 11041D, Feb. 11, 2003.
Tan, Loon-Seng, et al.; *Aromatic Polyamides Containing Ketobenzocyclobutene Pendants*; Journal of Polymer Science, Part A: Polymer Chemistry (1996), 34(17), pp. 3539-3549.
Strandjour, Andrew J.G., et al.; *Process Optimization and Systems Integration of a Copper/photosensitive Benzocyclobutene MCM-D: Dielectric Processing, Metallization, Solder Bumping, Device Assembly, and Testing*; International Journal of Microcircuits and Electronic Packaging (1996), 19(3), pp. 260-280.
Lee, W.M., et al.; *Thermal Oxidative Stability Lifetime Prediction for Benzocyclobutene Polymer Composites*; International SAMPE Symposium and Exhibition (1993), 38 (Advanced Materials: Performance Through Tec), pp. 1978-1992.
Lee, W.M., et al.; *Thermal Oxidative Stability of Diketone-bis-benzocyclobutene (DK-Bid-BCB)/Graphite Fabric Composite*; International SAMPE Symposium and Exhibition (1992), 37 (Mater. Work. You $21^{st}$ Century); pp. 679-689.
Yalvac, Selim, et al.; *A Comparative Thermal Fatigue Study of A370-5H/PMR-15 and A370-5H/Diketone Bis-benzocyclobutene Laminates*; International SAMPE Symposium and Exhibition (1991), 36(2), pp. 1181-1192.
Tan, Loon-Seng, et al.; *Benzocyclobutene in Polymer Synthesis. III. Heat-resistant Thermosets Based on Diels-Alder Polymerization of Bisbenzocyclobutene and a Bismaleimide*; Journal of Polymer Science, Part A: Polymer Chemistry (1988), 26(11), pp. 3103-3117.
Tan, Loon-Seng, et al.; *Benzocyclobutene in Polymer Synthesis. I. Homopolymerization of Bisbenzocyclobutene Aromatic Imides to Form High-temperature Resistant Thermosetting Resins*; Journal of Polymer Science, Part A: Polymer Chemistry (1988), 26(7), pp. 1819-1834.
Tan, Loon-Seng, et al.; *Benzocyclobutene in Polymer Synthesis. II. Solid State Diels-Alder Polymerization Utilizing an In-situ Generated Diene and an Alkyne*; Journal of Polymer Science, Part A: Polymer Chemistry (1987), 25(11), pp. 3159-3172.
Tan, Loon-Seng, et al.; *High-temperature Thermosetting Resins Based on Diels-Alder Polymerization of Compatible Mixtures of Bis(Benzocyclobutene(s and Bismaleimides*; Polymer Preprints (American Chemical Society, Division of Polymer Chemistry) (1986), 27(1), pp. 453-454.

*Primary Examiner* — Mark Eashoo
*Assistant Examiner* — Jessica Paul
(74) *Attorney, Agent, or Firm* — S. Matthew Cairns

(57) ABSTRACT

The use of hindered phenol containing anti-oxidants enable arylcyclobutene-based formulations to be cured in oxygen containing environments such as air without unacceptable degradation in key properties of dielectric constant, water uptake, or transmittance.

21 Claims, No Drawings

BENZOCYCLOBUTENE BASED POLYMER FORMULATIONS AND METHODS FOR PROCESSING SUCH FORMULATIONS IN OXIDATIVE ENVIRONMENTS

CROSS REFERENCE To RELATED APPLICATIONS

This application is a 371 of PCT/US2005/036452 filed Oct. 12, 2005, which claims the benefit of U.S. Provisional Application Serial No. 60/618,548, filed Oct. 13, 2004.

The present application relates to benzocyclobutene-based oligomer and polymer formulations and methods of processing such formulations.

Arylcyclobutene-based oligomers and polymers, and more specifically benzocyclobutene-based oligomers or polymers (herein collectively referred to as BCB), are known to be useful as low dielectric constant (insulating) materials in electronics manufacture. While use of various anti-oxidants have been taught and used in BCB for improving stability of the formulation shelf-life, improving stability of cured resin and improving resistance to oxidation during curing, it has generally been understood that cure should occur in a nitrogen atmosphere to avoid undesirable oxidation of the material. See for example *Cure and Oxidation Measurements for Cyclotene Advanced Electronics Resins*, www.dow.com, printed from website September 2004.

Applicants have made the surprising discovery that if hindered phenol containing antioxidants are used, arylcyclobutene-based formulations can be cured in oxygen containing environments such as air without unacceptable degradation in key properties of dielectric constant, water uptake, or transmittance.

Thus, the present invention in a first embodiment is a method comprising
 providing a composition comprising a curable arylcyclobutene-based material and an antioxidant compound having hindered phenol functionality, and
 curing the composition by heating in an oxidizing environment.

As used herein "oxidizing environment" means an environment that has more oxidizing effect on the arylcyclobutenes than an environment having 100 ppm oxygen. According to a second embodiment, the present invention is a composition comprising a curable arylcyclobutene-based material comprising acid functionality, an antioxidant compound having hindered phenol functionality, and, preferably, a photoactive compound. This embodiment is useful in aqueous development of a film of the composition that has been exposed (preferably imagewise exposed) to activating radiation for the photoactive compound which initiates the desired chemical changes (for example, photocure or photodeactivation of a dissolution inhibitor). Both embodiments may be used with appropriate solvents, coating agents, flow modifiers, and the like.

The Arylcyclobutene Material

The arylcyclobutene material may comprise a monomer of the formula or, more preferably, partially polymerized product (for example, oligomers or curable polymers) of monomer precursor(s) comprising monomers the formula

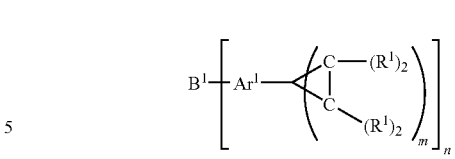

wherein
$B^1$ is an n-valent organic linking group, preferably comprising ethylenic unsaturation, or $B^1$ may be absent. Suitable single valent $B^1$ groups preferably have the formula —$CR^8$=$CR^9Z$, wherein $R^8$ and $R^9$ are independently selected from hydrogen, alkyl groups of 1 to 6, most preferably 1 to 3 carbon atoms, and aryl groups, and Z is selected from hydrogen, alkyl groups of 1 to 6 carbon atoms, aryl groups, —$CO_2R^7$ wherein $R^7$ is H, an alkyl group, preferably of up to 6 carbon atoms, an aryl group, an aralkyl group, or an alkaryl group. Most preferably Z is —$CO_2R^7$ wherein $R^7$ is an alkyl group, preferably of up to 6 carbon atoms, an aryl group, an aralkyl group, or an alkaryl group. Suitable divalent $B^1$ groups include —$(CR^8$=$CR^9)_o$-$(Z')_{o-1}$, wherein $R^8$ and $R^9$ are as defined previously, o is 1 or 2, and $Z'$ is an alkyl group of 1 to 6 carbon atoms, an aromatic group, or a siloxane group. Most preferably o is 2 and $Z'$ is a siloxane group.

$Ar^1$ is a polyvalent aromatic or heteroaromatic group and the carbon atoms of the cyclobutene ring are bonded to adjacent carbon atoms on the same aromatic ring of $Ar^1$. Preferably $Ar^1$ is a single aromatic ring;
 m is an integer of 1 or more, preferably 1;
 n is an integer of 1 or more, preferably 2-4 and more preferably 2;
 $R^1$ is a monovalent group, preferably hydrogen, alkyl of up to 6 carbon atoms.

The synthesis and properties of these arylcyclobutenes, as well as terms used to describe them may be found, for example, in U.S. Pat. Nos. 4,540,763; 4,724,260; 4,783,514; 4,812,588; 4,826,997; 4,999,499; 5,136,069; 5,185,391; 5,243,068 all of which are incorporated herein by reference.

According to one preferred embodiment, the monomer (a) has the formula

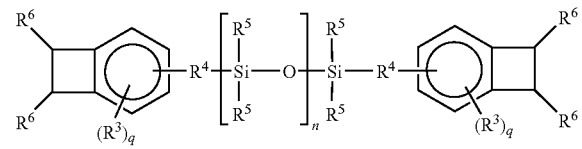

wherein
 each $R^3$ is independently an alkyl group of 1-6 carbon atoms, trimethylsilyl, methoxy or chloro;
 each $R^4$ is independently a divalent, ethylenically unsaturated organic group, preferably an alkenyl of 1 to 6 carbons, most preferably —$CH_2$=$CH_2$—;
 each $R^5$ is independently hydrogen, an alkyl group of 1 to 6 carbon atoms, cycloalkyl, aralkyl or phenyl; preferably $R^5$ is methyl;
 each $R^6$ is independently hydrogen, alkyl of 1 to 6 carbon atoms, chloro or cyano, preferably hydrogen;
 n is an integer of 1 or more;
 and each q is an integer of 0 to 3, preferably q is 0 (in which case the benzene ring has 3 hydrogen atoms bonded to it).

The most preferred monomers are 1,3-bis(2-bicyclo[4.2.0] octa-1,3,5-trien-3-yl ethenyl)-1,1,3,3 tetramethyldisiloxane (referred to herein as DVS-bisBCB).

The preferred organosiloxane bridged bisbenzocyclobutene monomers can be prepared by methods disclosed for example in U.S. Pat. Nos. 4,812,588; 5,136,069; 5,138,081 and WO 94/25903.

According to one preferred embodiment the arylcyclobutene-based oligomer or polymer comprises acid functionality which enables the material to be developed in aqueous solutions. One method for providing such acid functionality is to include acid functional monomers along with the preferred monomers, preferably, prior to partial polymerization of the materials to form oligomers. This approach is generally taught in U.S. Pat. No. 6,361,926. Suitable additional monomers include the formula:

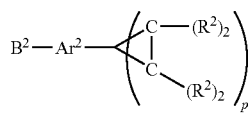

wherein $B^2$ is a monovalent organic group with acid functionality, preferably also containing ethylenic unsaturation;

$Ar^2$ is a polyvalent aromatic or heteroaromatic group and the carbon atoms of the cyclobutene ring are bonded to adjacent carbon atoms on the same aromatic ring of $Ar^2$, preferably $Ar^2$ is a single aromatic ring;

p is an integer of 1 or more, preferably 1; and $R^2$ is a monovalent group, preferably hydrogen, alkyl of up to 6 carbon atoms.

Preferably, such additional monomer is selected from the following two formulas

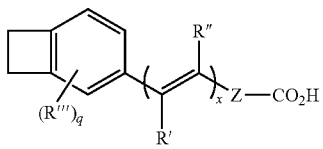

wherein

R' and R" are independently selected from hydrogen, alkyl groups of 1 to 6 carbon atoms, aryl groups, or R' and R" taken together form a cyclic group of 4 to 8 carbon atoms; each R'" is independently an alkyl group of 1-6 carbon atoms, trimethylsilyl, methoxy or chloro;

Z is a carbon to carbon bond or an aryl group;

x is an integer from 0 to 3, preferably 1; and q is an integer of 0 to 3, preferably 0; or

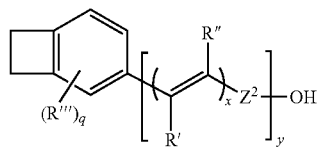

wherein

R' and R" and R'" and q are as defined above, x is 1, y is 0 or 1, and $Z^2$ is an aryl group.

Alternatively a monomer characterized by the presence of a cyclobutarene group and a pendant functionality which at least partially reacts during polymerization of monomers to form a pendant acid group. Preferably, this alternative monomer has the formula:

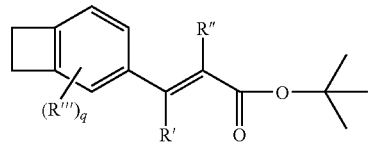

wherein R' and R" and R'" and q are as defined above and R' and R" are preferably hydrogen. When the above monomer, which can be prepared by a palladium-catalyzed reaction of bromobenzocyclobutene and t-butyl acrylate, is polymerized, the resulting polymer has both acrylate ester and acrylic acid functionalities.

According to the preferred embodiment suitable for aqueous development the BCB material preferably has acid functionality in equivalent weights of up to about 600 g/mole of acid functionality, more preferably up to about 500 grams/moles of acid functionality. The equivalent weight is preferably at least 100 grams/mole of acid functionality, more preferably at least 200 grams/mole of acid functionality.

Alternative approaches for including acid functionality may also be used, such as are taught in WO 04/038505.

The arylcyclobutene materials are preferably B-staged (that is partially polymerized). Other components may be added before or after B-staging. B-staging preferably occurs in solvent but may occur neat (that is without solvent). B-staging preferably occurs at a temperature in the range of about 125 to about 250° C., more preferably about 130 to about 200° C. The polymerization may occur for a time determined to provide a partially polymerized resin that provides the desired properties with regard to subsequent processability. Preferably, the curable product has an apparent weight average molecular weight (Mw) as determined by Gel Permeation Chromatography (GPC) in the range of at least about 1000, more preferably at least about 1500, more preferably still at least about 2000 and most preferably at least about 5000 g/mol. The maximum Mw is preferably about 300,000, more preferably about 250,0000 g/mol. For aqueous developable arylcyclobutene oligomers the Mw is preferably less than about 50,000, more preferably less than about 35,000, more preferably still less than about 20,000, and most preferably less than about 10,000 g/mol.

The Antioxidant

The inventors have made the surprising discovery that antioxidants with hindered phenol functionality perform substantially better in enabling cure of arylcyclobutene, preferably BCB, materials in air without undue degradation of key properties than do other known antioxidants. Non-limiting examples of suitable hindered phenol anti-oxidants include the following:

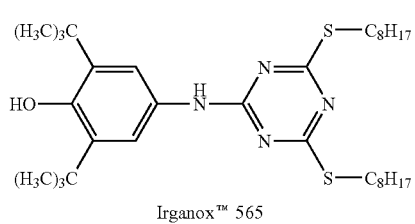
Irganox™ 565
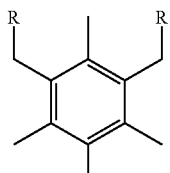
Irganox™ 1330
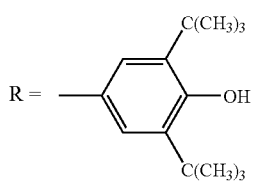
R =
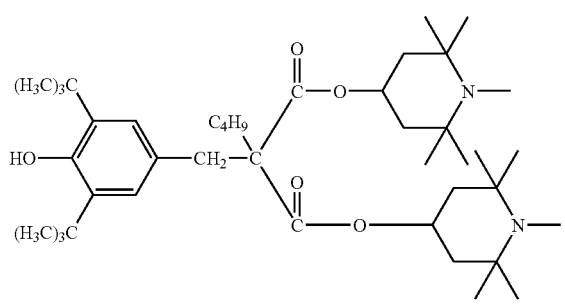
Tinuvin™ 144
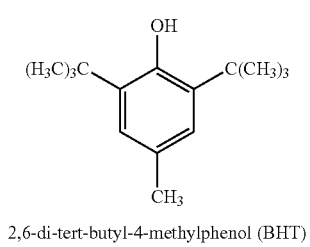
2,6-di-tert-butyl-4-methylphenol (BHT)
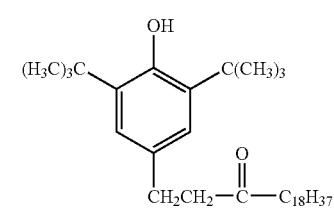
Irganox™ 1076
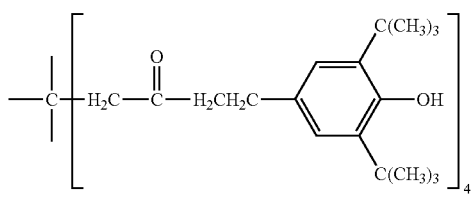
Irganox™ 1010
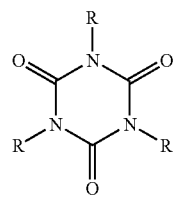
Irganox™ 3114
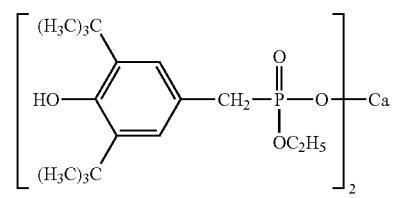
Irganox™ 1425
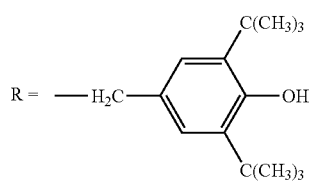
R =
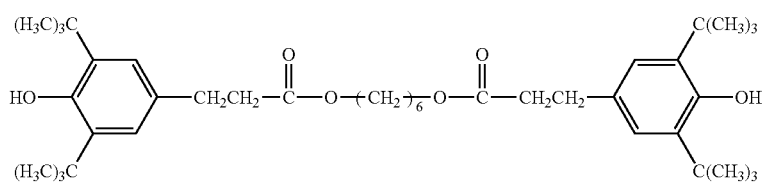
Irganox™ 259
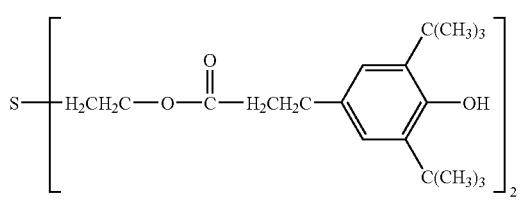
Irganox™ 1035

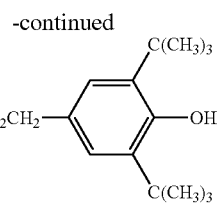
Irganox™ 1098

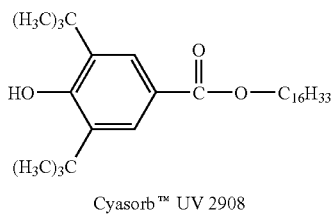
Tinuvin™ 120    Cyasorb™ UV 2908

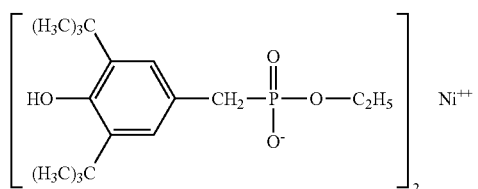
Irgastab™ UV 2002

The Irganox, Irgafos and Tinuvin products are from Ciba Specialty Chemicals Corp. Cyasorb is from Cytec Industries, Inc.

One may use combinations of hindered phenol antioxidants with other hindered phenol antioxidants or with other classes of antioxidants such as hindered amines, phosphites, thiol compounds. Examples of such additional antioxidants include:

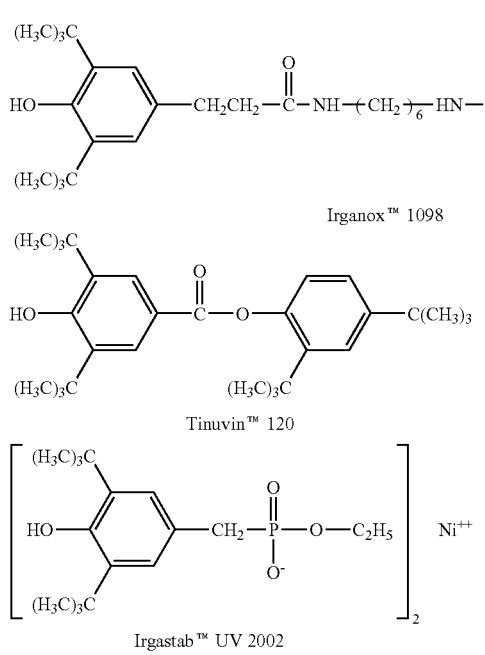
Irgafos™ 12

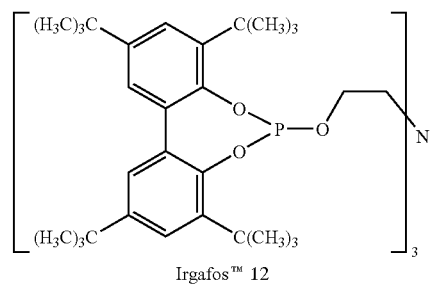
Irganox™ 1726

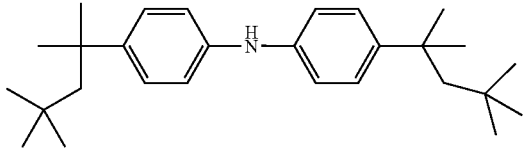
Iragnox™ 5057

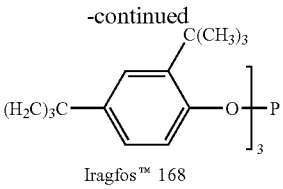
Iragfos™ 168

The amount of hindered phenol antioxidant added to the composition is preferably at least 0.2% based on weight of the polymer, more preferably at least 0.5% and most preferably at least 1%. The total amount of all antioxidants is preferably less than 10% by weight of polymer, more preferably no greater than 6%, and most preferably no greater than about 4%.

Other Components

The arylcyclobutene and antioxidant formulation may preferably also include various other components.

Solvents are useful as a means to facilitate application of the formulation to substrates to form thin films. Suitable solvents include, but are not limited to aromatic hydrocarbons such as toluene, xylene and mesitylene; $C_3$-$C_6$ alcohols; methylcyclohexanone; N-methylpyrrolidinone; butyrolactone; dipropylene glycol dimethyl ether isomers (commercially available from The Dow Chemical Company as Proglyde™ DMM), propylene glycol methyl ethyl acetate (PGMEA), Dowanol™ DPMA (di(propylene glycol) methyl ether acetate isomers available from The Dow Chemical Company). A mixture of Proglyde™ DMM and PGMEA is preferred.

It may be convenient to select solvents such that they can dissolve the monomers prior to B-staging (that is partial polymerization) as well as serve as a suitable solvent carrier for the partially polymerized product for coating purposes.

The composition may also desirably include photoactive agents which enables one to form an image in the film by imagewise exposure to activating wavelengths of radiation and later development of the image with a suitable developing solution. According to a first approach, the photosensitive composition generally comprises a photoactive compound which is a photoinitiator that initiates further cure or cross-linking of the curable polymer. Examples of such compounds include peroxides, azo compounds and benzoin derivatives. See, for example, Photoreactive Polymers; Wiley-Interscience Publication; 1989, pp. 102-127. When exposed to activating radiation, the exposed portions of the composition become insoluble to the developer. Examples of suitable developers include 1,3,5-triisopropylbenzene, decalin, Stoddard reagent, and DS2100 from The Dow Chemical Company which is a mixture of Proglyde DMM and Isopar™ L from Exxon-Mobil. See for example, Dissolution Properties of Photobenzocyclobutene Films, Proceedings of the 10$^{th}$ International Conference on Photopolymers, October-November, 1994, pp. 453-461.

According to a second preferred approach, the photosensitive composition comprises a compound which serves as a dissolution inhibitor. When the photopolymer composition is exposed to activating radiation, the dissolution inhibitor ceases to function. When the developer solution is applied to the layer of the exposed photopolymer composition, those portions that were exposed to activating radiation are removed. The photosensitive composition may comprise a photoactive compound and a separate dissolution inhibitor or, preferably the dissolution inhibitor may itself be photoactive. Non-limiting examples of suitable photosensitive, dissolution-inhibiting compositions/compounds include diazonaphthoquinone sulfonyl esters of aromatic compounds such as, for example 2,3,4-trihydroxybenzophenone (THBP), 1,1,1-tris(4-hydroxyphenyl)ethane (THPE), or mixtures of THBP and THPE or cumyl phenol. See Photoreactive Polymers; Wiley-Interscience Publication; 1989, p. 187. The developer solution is preferably an aqueous base solution. The preferred pH is in the range of 12 to 14. Examples of suitable developers include NaOH, LiOH, KOH, RbOH, CsOH, Me$_4$NOH, Et$_4$NOH. See, for example, Photoreactive Polymers, Wiley-Interscience Publication, 1989, p. 216.

In the preferred aqueous developable solutions having dissolution-inhibiting compounds, the dissolution-inhibiting compound (for example, the diazonaphthoquinones) are activated by exposure to radiation to form carboxylic acid groups which assist in the development of the exposed portions of the film in aqueous solution.

Other components that may be used include coating aids, adhesion promoters, fillers and the like.

Notably, the Inventors have made the surprising discovery that when the antioxidants specified herein are used, difficulties previously encountered in regard to compatibility of anti-oxidant and alkyoxysilane or acyloxysilane based adhesion promoters are substantially avoided. Thus, according to one preferred embodiment the invention is a composition comprising a curable arylcyclobutene-based polymer or oligomer as set forth above, a hindered phenol anti-oxidant as set forth above and an adhesion promoter which is the hydrolyzed or partially hydrolyzed reaction product of alkoxy or acyloxy silanes. The silanes preferably have the formula:

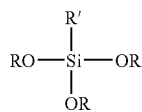

where R is alky or carboxyl, and R' is alkyl, alkenyl, aryl or vinyl. The silane is partially or completely hydrolyzed and condensed to form a polysiloxane. The preferable molecular weight range of the polysiloxane is from 250 to 6,000 g/mol. The more preferable molecular weight range of the polysiloxane is from 300 to 3,000 g/mol and the most preferable molecular weight range of the polysiloxane is from 400 to 1,000 g/mol. The preferable range of the polysiloxane in the self-primed formulation is 0.1% to 10% based on DVS-bis-BCB prepolymer. The more preferable range of the polysiloxane in the self-primed formulation is 0.2% to 5% based on DVS-bisBCB prepolymer. The most preferable range of the polysiloxane in the self-primed formulation is 0.5% to 4% based on DVS-bisBCB prepolymer.

Method of Processing and Properties

After preparing the formulation of arylcyclobutene materials and antioxidant (and any additional optional components), the arylcyclobutenes are cured in an oxidizing environment. As used herein "oxidizing environment" means an environment that has more oxidizing effect on the arylcyclobutenes than an environment having 100 ppm oxygen. Preferably, the oxidizing comprises more than 100 ppm oxygen, more preferably more than 200 ppm oxygen, more preferably still at least 1% by volume oxygen, and more preferably yet at least 5% by volume oxygen. Most preferably the oxidizing environment is air. This cure occurs by heating, preferably to a temperature greater than 200° C., more preferably greater than 205° C., and most preferably no less than about 210° C., but preferably less than 300° C. Time for cure after reaching the desired cure temperature is about 15 minutes to 3 hours, depending on temperature.

Additional process steps preferably include one or more of the following:

Coating the formulation from solvent to form a thin film on a substrate. Spin coating is a suitable and preferred method although other coating methods may be employed. Cure would occur after the coating step.

Patterning the coated films using standard lithographic processes with masks. A reactive ion etching environment is preferably used. Cure may occur before or after this etch step but preferably before.

If a photoactive formulation is used, the coated formulation is imagewise exposed to activating radiation before being exposed to suitable developer solutions. The preferred photoactive formulations comprise acid functionality and are developable in aqueous base developers as listed above.

The method of this invention surprisingly provides cured films that show only very small effects on key properties despite the cure in oxidizing environments. The dielectric constant of these cured films is less than 3, preferably less than 2.95. Dielectric constant is preferably measured by the method described in Proceedings, 33$^{rd}$ International Symposium on Microelectronics, September 2000, p. 81. The dielectric constant as compared to samples cured in nitrogen preferably shows less than a 5% increase in the value. The dielectric constant as compared to samples cured in air with no antioxidant preferably shows at least 2% decrease in the value.

The materials of this invention provide transmittance of 400 nm radiation of at least 90%, preferably at least 95% and transmittance of 375 nm radiation of at least 85% preferably at least 90%. Transmittance is preferably measured with a Perkin-Elmer Lambda 3B UV/Visible Spectrophotometer. Scanning range was from 300 nm to 800 nm. The transmittance at 400 nm preferably shows less than a 5% decrease in the value as compared to nitrogen cured samples. The transmittance at 375 nm preferably shows less than a 10% decrease in value as compared to nitrogen cured samples. The transmittance at 400 nm preferably is more than 5% higher than for samples cured in air with no antioxidant. The transmittance at 375 nm is preferably more than 10% higher than for samples cured in air with no antioxidant.

Water uptake for these samples is preferably less than 2%, more preferably less than 1.9% weight percent based on weight of polymer. Water uptake is measured by the method described in Transaction of ASME, 2000, pp. 28-33. This method includes weighing 4 inch wafers having known thickness of coated, cured polymer on it; placing the wafers in 85% relative humidity environment at room temperature until equilibrium is reached, and then reweighing the samples. The weight difference divided by weight of polymer based on volume and density of coated and cured polymer allows one to calculate percent water uptake. Water uptake is preferably at least about 10% lower than for samples cured in air with no antioxidant. Water uptake is preferably no more than about 25% higher, more preferably no more than 20% higher, than for samples cured in nitrogen.

Addition of certain additives, such as photoactive agents, may impact some of the values of the key properties. For instance, use of diazonaphthoquinone compounds as photoactive agents tends to increase the water uptake and increase dielectric constant. For formulations comprising DNQ compounds, the dielectric constant preferably is no more than 3.0 and water up-take is preferably no more than 2.1.

EXAMPLES

Example 1

BCB-Acrylic Acid and DVS-bisBCB Copolymer Cured in Air

A. Synthesis of BCB-Acrylic Acid and DVS-bisBCB Copolymer

Procedure of BCB-acrylic acid synthesis is reported in U.S. Pat. No. 6,361,926. BCB-acrylic acid (90 g, 0.517 mole), DVS-bisBCB (110 g, 0.282 mole, mole ratio of BCB-acrylic acid and DVS-bisBCB was 65 to 35) and 300 g of di(propylene glycol) dimethyl ether (Proglyde™ DMM) were placed in a 1L 3-necked flask equipped with a mechanical stirrer, a condenser connected to a nitrogen inlet and a thermometer. The flask was heated with stirring under nitrogen until the desired molecular weight was reached. Samples used in Example 1B had Mw of about 5480 g/mole. Resin solution had 40 wt % solids.

B. Dry Etch Air Curable BCB-Acrylic Acid and DVS-bis-BCB

Resin solution described in Example 1A (8.0 g, 3.2 g prepolymer) was mixed with 3.02 g of Proglyde DMM and 4.21 g of propylene glycol methyl ether acetate (PGMEA). Polymer content was 21 wt % and wt ratio of Proglyde DMM to PGMEA was 65 to 35. Irganox 565 from Ciba Specialty Chemicals (65 mg, 2 wt % based on polymer) was added. The solution was filtered with a 1 µm syringe filter. For water up-take, the solution was applied to a 4 inch silicon wafer, spread at 500 rpm for 10 seconds and spin-coated at 1000 rpm for 30 seconds. The wafer was baked at 85° C. for 90 seconds. For UV/visible percentage transmittance, the same processing procedure was used to spin-coat the solution on a 4 inch glass wafer. For dielectric constant measurement, the solution was coated at 1150 rpm on top of a high conducting silicon wafer. The wafers were then cured in an air-circulating oven which ramped from room temperature to 210° C. at 10° C. per minute. Temperature was held at 210° C. for 90 minutes and then the oven was allowed to cool to room temperature. Nitrogen cure was carried out by heating the oven from room temperature to 250° C. at 10° C. per minute. Temperature was held at 250° C. for 60 minutes and then the oven was allowed to cool to room temperature. Similar procedures were used to make solution samples 1 to 22 with the appropriate amount of antioxidants added. Samples 1 to 13 and samples 14 to 22 were produced and processed on two separate days. As can be seen from looking at Control 1 and Control 16 due to experimental error between the batches the results in one batch are not reasonably compared with results in the other batch. Results are illustrated in Table 1.

TABLE 1

| # | Antioxidant | dielectric constant | T at 400 nm, % | T at 375 nm, % | water up-take |
|---|---|---|---|---|---|
| Control 1 | no antioxidant | 3.01 | 94.3 | 84.9 | 2.13 |
| 2 | 4% Irganox 565 | 2.91 | 97.3 | 94.4 | 1.65 |
| 3 | 4% Irgafos 168 | 2.95 | 93.7 | 83.9 | 2.06 |
| 4 | 2% Irganox 565 | 2.92 | 97.2 | 93.9 | 1.69 |
| 5 | 2% Irgafos 168 | 2.94 | 94.4 | 85.8 | 2.09 |
| 6 | 2% Irganox 565 + 2% Irgafos 168 | 2.90 | 96.8 | 93.2 | 1.76 |
| 7 | 1% Irganox 565 + 1% Irgafos 168 | 2.92 | 96.7 | 92.7 | 1.74 |
| 8 | 4% Goodrite | 2.94 | 92.4 | 86.0 | 1.88 |
| 9 | 4% Irganox 1726 | 2.96 | 94.6 | 85.9 | 2.02 |
| 10 | 4% Irgafos 12 | 2.95 | 94.2 | 84.8 | 2.11 |
| 11 | 2% Irganox 565 + 2% Irgafos 12 | 2.93 | 97.3 | 93.8 | 1.71 |
| 12 | 2% Irganox 1726 + 2% Irgafos 168 | 2.97 | 94.4 | 85.5 | 2.05 |
| 13 | 2% Irganox 1726 + 2% Irgafos 12 | 2.98 | 94.8 | 86.4 | 2.14 |
| 14 | 1% Irganox-1330 + 1% Ix-1726 | 2.98 | 94.1 | 86.7 | 2.15 |
| 15 | 2% Irganox-565 | 2.92 | 94.5 | 87.2 | 1.8 |
| Control 16 | no anti, air cure | 3.07 | 89.3 | 75.4 | 2.13 |
| Control 17 | no anti, N2 cure | 2.87 | 97.5 | 95.5 | 1.56 |
| 18 | 0.7% Ir-1330, 0.7% Ir-1726, Ir-5057 | 3 | 93.4 | 84.2 | 1.83 |
| 19 | 2% Ir-1330 | 2.95 | 94.9 | 88 | 1.8 |
| 20 | 1% Ir-1726, 1% Ir-5057 | 3.08 | 88.5 | 73.4 | 2.17 |
| 21 | 2% Ir-5057 | 3.04 | 90.5 | 78 | 2.17 |
| 22 | 1% Ir-1330, 1% Ir-5057 | 2.99 | 93.8 | 85.1 | 1.92 |

Example 2

Air Curable Photosensitive BCB-Acrylic Acid and DVS-bisBCB Copolymer Formulated with Diazonaphthoquinone as the Photoactive Component and Antioxidant A. Preparation of Formulation.

Five hundred and eighty six grams of a 40% solution of BCB-acrylic acid (65 mole %) and DVS-bisBCB (35 mole %) copolymer with Mw of 5901 g/mole in Proglyde DMM prepared in a similar fashion as Example 1A was placed in a 2 L amber bottle. PGMEA (457 g) and Proglyde DMM (22 g) were added to adjust Progylde DMM to PGMEA ratio to become 45 to 55. Diazonaphthoquinone sulfonate ester (70% esterified) prepared from a 1 to 1 mixture of 2,3,4-trihydroxy-benzophenone and 1,1,1-tris(4-hydroxyphenyl)ethane (51.5 g, 18 wt %) was added. Irganox 565 (4.8 g, 2 wt %) and Irgafos 168 (4.8, 2 wt %) were also added. The solution was filtered through a 1 µm filter.

B. UV/Visible Spectra of Aqueous-Base-Developable Photoformulation Containing Hindered Phenol Antioxidant.

The above solution was spread on a 4 inch glass wafer at 500 rpm for 10 seconds followed by spinning at 1500 rpm for 30 seconds. The wafer was then baked at 95° C. for 2 minutes and then flood exposed with broadband exposure at 250 mJ/cm$^2$ as calibrated at 365 nm. The wafer was cured at 210° C. for 90 minutes in an air-circulating oven. The experiment was repeated with a cure performed in a nitrogen oven at 250° C. for 1 hour. The UV spectra of samples cured in air and cured in nitrogen were compared and the nitrogen cured sample was better, but the air cured sample showed transmittance of approximately 90% at 400 nm.

C. Dielectric Constant and Water Uptake of Aqueous-Base-Developable Photoformulation Containing Hindered Phenol Antioxidant.

The solution described in Example 2A was spread on a 4 inch high conductivity silicon wafer at 500 rpm for 10 seconds followed by spinning at 1500 rpm for 30 seconds. The wafer was then baked at 95° C. for 2 minutes and then cured in an air-circulating oven at 210° C. for 90 minutes. The same experiment was performed with a 4 inch silicon wafer.

Table 2 shows dielectric constant of a BCB-acrylic acid and DVS-bisBCB copolymer formulated with 18 wt % diazonaphthoquinone, 2% Irganox 565, and 2% Irgafos 168 cured in nitrogen and in air percentage based on polymer. Results of a control experiment without any antioxidant is included for comparison.

TABLE 2

|  | 2% Irganox 565 + 2% Irgafos 168, Cured in N$_2$ | 2% Irganox 565 + 2% Irgafos 168, Cured in air | Without antioxidant Cured in air |
|---|---|---|---|
| Dielectric constant | 2.9 | 3.0 | 3.1 |
| Dissipation factor | 0.013 | 0.014 | 0.014 |

Table 3 shows water absorption of a BCB-acrylic acid and DVS-bisBCB copolymer formulated with 18 wt % diazonaphthoquinone and, 2% Irganox 565 and 2% Irgafos 168 cured in nitrogen and in air, percentage based on polymer. Results of a control experiment without any antioxidant is included for comparison.

TABLE 3

|  | 2% Irganox 565 + 2% Irgafos 168, Cured in N$_2$ | 2% Irganox 565 + 2% Irgafos 168, Cured in air | Without antioxidant Cured in air |
|---|---|---|---|
| Water absorption (%) at 50% relative humidity | 1.2 | 1.3 | 1.4 |
| Water absorption (%) at 85% relative humidity | 2.0 | 2.1 | 2.2 |

D. Lithography of Aqueous-Base-Developable BCB Containing Hindered Phenol Antioxidant.

AP3000 from The Dow Chemical Company was applied to a 4-inch silicon wafer at 2000 rpm followed by baking at 150° C. for 90 seconds. The solution described in Example 2A was then spread on the wafer at 500 rpm for 10 seconds followed by spin-coating at 1000 rpm for 30 seconds. The wafer was baked at 85° C. for 2 minutes. Film thickness after bake was 3.05 μm. The wafer was exposed at broadband with a Karl Suss exposure tool having a 10 μm gap between the mask and the film. Exposure dose was 250 mJ/cm$^2$ as determined by a radiometer calibrated at 365 nm. After exposure, the wafer was placed in a 2.38% tetramethylammonium hydroxide bath for 63 seconds to develop a patterned film. Film thickness after development was 2.77 μm (91% film retention). The patterned film was cured at 210° C. for 90 minutes in a Blue-M oven in air. Film thickness after cure was 2.31 μm (76% film retention).

Example 3

Air Curable DVS-bisBCB Polymer

A. UV/Visible Spectra of Dry Etch DVS-bisBCB.

A prepolymer was prepared by heating 25 wt % of DVS-bisBCB in mesitylene. The prepolymer solution (10 g) was placed in a vial. Mesitylene (2.5 g) was added to dilute the solution to 20%. Irganox 565 (51 mg, 2 wt % based on DVS-bis BCB prepolymer weight) and Irgaofos 168 (51 mg, 2 wt % based on DVS-bisBCB prepolymer weight) were added. The solution was spread on a glass wafer at 500 rpm for 10 seconds followed by spinning at 1500 rpm for 30 seconds. The wafer was baked at 80° C. for 90 seconds. Another glass wafer was prepared the same way except the solution did not contain any antioxidant. The two wafers were cured in an air-circulating oven at 210° C. for 90 min. UV-visible spectra of the two wafers were recorded. The wafer containing antioxidants has higher than 97% transmittance at 400 nm whereas transmittance of the wafer without antioxidant was 78% at 400 nm.

B. Lithography of Photosensitive DVS-bisBCB Polymer Containing Hindered Phenol Antioxidant.

Formulation:

The air-curable photo DVS-bisBCB formulation was composed of b-staged DVS-bisBCB resin, 2,6-bis(4-azidobenzylidene)-4-ethylcyclohexanaone (BAC-E), mesitylene, Irganox 565, and Irgafos 168. The material was formulated by adding 0.2574 g (2 wt % based on DVS-bisBCB prepolymer weight) of Irganox 565 and 0.2574 g (2 wt % based on DVS-bisBCB prepolymer weight) of Irgafos 168 added to 26.00 g of 49.5% b-staged DVS-bisBCB in mesitylene. Four weight percent BAC-E based on DVS-bisBCB prepolymer weight (0.5148 g) was then added. The formulation was diluted to 35% BCB by the addition of mesitylene (5.33 g).

The formulation was then placed on a shaker for 3 hours and at this point a homogeneous solution was produced. This formulation was then capable to give thin films of thickness in the range of 3.3 μm to 6.0 μm. Proper care must be taken not to let the formulation remain at room temperature for over 24 hours. The formulation was then placed in a −15° C. freezer until time of use.

Processing:

The formulation was removed from freezer and allowed to reach room temperature before use. Film coating on a 4 inch silicon wafer was performed using a spin coating process. A 4 inch silicon wafer was placed on a chuck and held in place by vacuum. AP3000 from The Dow Chemical Company was applied on the wafer followed by dispensing 3 mL of the formulation in the middle of the silicon wafer using a syringe with a 1 μm syringe filter. The wafer was then rotated at 500 rpm for 5 seconds to spread the resin across the wafer. The spin speed was increased to 1000 rpm for 30 seconds followed by a hot plate bake of 75° C. for 90 seconds, in hard contact.

The above mentioned wafer was patterned as follows. Exposure tool was a Karl Suss Mask Aligner, with measured intensity at 365 nm wavelength. The test pattern to be exposed was a series of via banks. The wafer was placed in the exposure tool with a 30 μm exposure gap setting and exposed to 365 nm wavelength for a dose of 200 mJ/cm².

Developing of the patterned film was done using a puddle develop method. This process used the same spin coater that was previously used in coating the wafers with resin. The wafer was placed on a chuck and held down by vacuum. The wafer was slowly rotated at 50 rpm for 5 seconds while DS2100 was dispensed on to the wafer until it was completely covered. The rotation of the wafer was then stopped, with DS2100 puddled on the film. After 48 seconds the unexposed areas were completely dissolved from the wafer. The wafer was then rotated at 50 rpm for 10 seconds while DS2100 was dispensed on the film. With the DS2100 dispense stopped, the wafer spin speed was increased to 3000 rpm for 20 seconds to dry the film. The film was then cured for 210° C. for 90 minutes in a Blue-M oven in air.

Example 4A

Lithography of Photosensitive Self-Primed DVS-bisBCB Polymer Containing Hindered Phenol Antioxidant Formulation:

The self-priming photo DVS-bisBCB formulation consisted of pre-hydrolyzed vinyltrimethoxysilane (VTMS) in dilute hydrochloric acid, b-staged DVS-bisBCB resin in mesitylene, BAC-E, mesitylene, Irganox 565 and Irgafos 168. The pre-hydrolyzed VTMS was produced as follows. In a 100 mL round bottom flask, 5.35 g of $10^{-3}$ M HCl was added. The flask was then placed in a heating mantle on top of a stirring plate. Two thermocouples were used to assist the controller in monitoring and controlling the reaction temperature. While the hydrochloric acid solution was being stirred, 44.04 g of an equal mole ratio mixture of water and VTMS was added. After the addition of VTMS and water mixture was completed, the solution temperature went up to 39° C. in 15 minutes. The controller was then started to heat the solution to 50° C. to advance the reaction of the VTMS solution, starting to build the molecular weight of the pre-hydrolyzed VTMS. Reaction temperature was held at 50° C. for 5 hours and then lowered to room temperature. Molecular weight of the pre-hydrolyzed VTMS was found to 593 after this 5 hour period.

The material was formulated in the following fashion with 0.5869 g (2 wt %) of Irganox 565 and 0.5869 g (2 wt %) of Irgafos 168 added to 57.20 g of 51.3% b-staged DVS-bisBCB in mesitylene. The next material added to the formulation was BAC-E. The amount of BAC-E was 1.027 g (4 wt % based on DVS-bisBCB prepolymer). The pre-hydrolyzed VTMS described above was then added to this mixture of DVS-bisBCB b-staged resin at a concentration of 1% based the weight fraction of VTMS in the prehydrolasate and the DVS-bisBCB prepolymer (0.33 g). The formulation was then diluted to 40% DVS-bisBCB solids by the addition of mesitylene (8.29 g).

Processing:

The formulation was removed from freezer and allowed to reach room temperature before use. Film coating on a 4 inch silicon wafer was performed using a spin coating process. A 4 inch silicon wafer was placed on a chuck and held in place by vacuum. With the wafer on the chuck, 3 mL of the formulation was dispensed in the middle of the silicon wafer using a syringe with a 1 μm syringe filter. The wafer was then rotated at 500 rpm for 5 seconds to spread the resin across the wafer. The speed was increased to 2500 rpm for 30 seconds followed by a hot plate bake of 75° C. for 90 seconds, in hard contact.

The spin-coated film was ready for patterning. This was done by means of a Karl Suss Mask Aligner, with measured intensity at 365 nm wavelength. The test pattern to be exposed was a series of via banks. The wafer was placed in the exposure tool with a 30 μm exposure gap setting and exposed to 365 nm wavelength for a dose of 168 mJ/cm².

Developing of the patterned film was done using a puddle develop method. This process used the same spin coater that was previously used in coating the wafers with resin. The wafer was placed on a chuck and held down by vacuum. The wafer was slowly rotated at 50 rpm for 5 seconds while DS2100 was dispensed on to the wafer until it was completely covered. The rotation of the wafer was then stopped, with DS2100 puddled on the film. After 37.7 seconds the unexposed areas were completely dissolved from the wafer. The wafer was then rotated at 50 rpm for 10 seconds while DS2100 was dispensed on the film. With the DS2100 dispense stopped, the wafer spin speed was increased to 3000 rpm for 20 seconds to dry the film. The film was then cured.

The modified edge-leftoff test (mELT) showed a K1c value of 0.39 mPa√m for Example 4 containing prehydrolyzed VTMS. The K1c value of a sample without prehydrolyzed VTMS and without using AP3000 as adhesion promoter was less than 0.24 mPa√m. The mELT method was described in Transaction of the ASME, Vol. 122 (2000), pp. 28-33.

4B. (Comparative) Self-Primer in DVS-bisBCB Polymer Containing Agerite MA Antioxidant Cyclotene™ 3022-57 (24.75 g), from The Dow Chemical Company, containing Agerite MA which is polymerized 1,2-dihydro-2,2,4-trimethylquinoline from R.T. Vanderbilt Co. Inc., was placed in a vial. Agerite MA in Cyclotene 3022-57 was 3.5 wt % based on DVS-bisBCB prepolymer. Prehydrolyzed VTMS (0.5 g, 3.5 wt % based on DVS-bisBCB prepolymer) prepared as described above was added to the vial. After mixing, a heavy precipitation occurred on the bottom of the glass container. With only 2 additives that went into the formulation, each of which is independently compatible with the prepolymer and solvent, it was determined that Agerite MA and the self-primer, prehydrolyzed VTMS, are incompatible.

Cyclotene™ 3022-57 (24.825 g), from The Dow Chemical Company, containing Agerite MA which is polymerized 1,2-dihydro-2,2,4-trimethylquinoline from R.T. Vanderbilt Co. Inc., was placed in a vial. Agerite MA in Cyclotene 3022-57 was 3.5 wt % based on DVS-bisBCB prepolymer. Prehydrolyzed Vinyltriacetoxy silane(VTAS) (0.175 g, 1 wt % based on DVS-bisBCB prepolymer) prepared as described above was added to the vial. After mixing, a precipitation occurred on the bottom of the glass container. With only 2 additives that went into the formulation, each of which is independently compatible with the prepolymer and solvent, it was determined that Agerite MA and the self-primer, prehydrolyzed VTMS, are incompatible.

What is claimed is:

1. A method comprising
providing a composition comprising a curable arylcyclobutene-based material and an antioxidant compound having hindered phenol functionality, and
curing the composition by heating in an oxidizing environment having more than 200 ppm oxygen.

2. The method of claim 1 wherein the arylcyclobutene-based material is the B-staged product of monomers including monomers of the formula

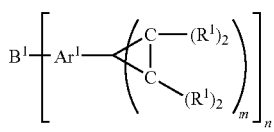

wherein $B^1$ is an n-valent organic linking group;

$Ar^1$ is a polyvalent aromatic or heteroaromatic group and the carbon atoms of the cyclobutene ring are bonded to adjacent carbon atoms on the same aromatic ring of $Ar^1$;

m is an integer of 1 or more;

n is an integer of 1 or more; and $R^1$ is a monovalent group.

3. The method of claim 2 wherein the monomers comprise 1,3-bis(2-bicyclo[4.2.0]octa-1,3,5-trien-3-ylethenyl)-1,1,3,3 tetramethyldisiloxane.

4. The method of claim 2 wherein the arylcyclobutene material comprises acid functionality.

5. The method of claim 2 wherein the composition comprises at least one photoactive agent.

6. The method of claim 5 wherein the photoactive agent is selected from bisazides and diazonaphthoquinones.

7. The method of claim 2 further comprising coating the composition onto a substrate from a solvent prior to curing and removing the solvent.

8. The method of claim 7 where a photoactive agent is used; the composition is exposed to activating radiation; and exposed portions are removed with a developer solution.

9. The method of claim 2 wherein the hindered phenol antioxidant is selected from the group consisting of

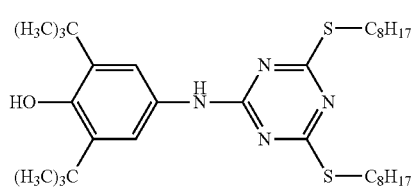
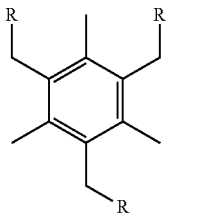
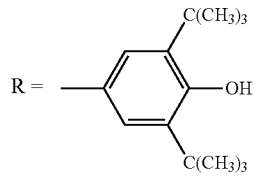
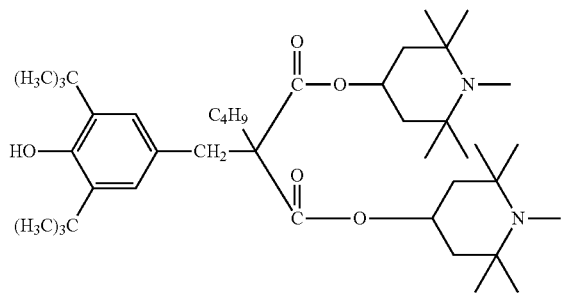
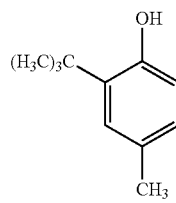
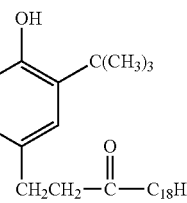
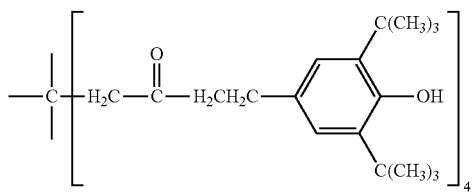
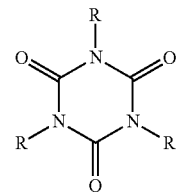
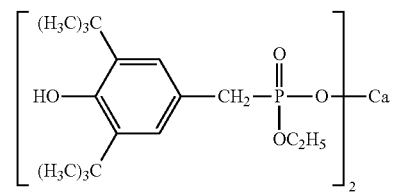
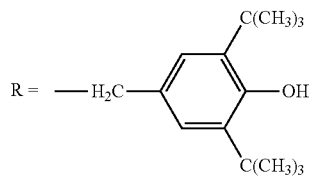
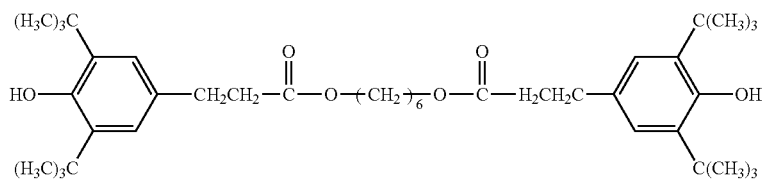

-continued

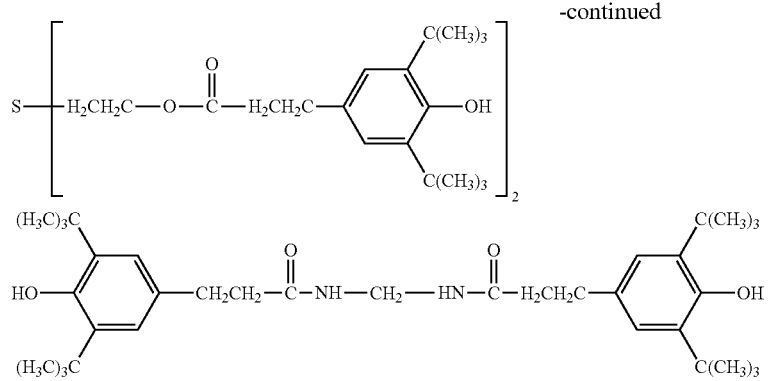

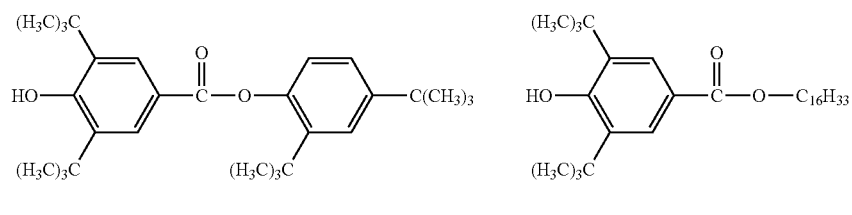

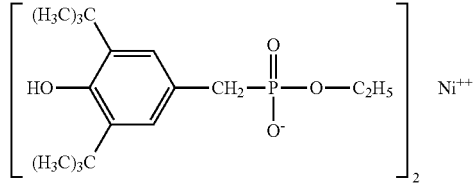

and mixtures of two or more thereof.

10. The method of claim 2 wherein the amount of hindered phenol antioxidant is in the range of 0.2 to 6% by weight based on weight of the polymer.

11. The method of claim 2 where a second antioxidant is used and the total amount of antioxidants is less than 10%.

12. The method of claim 2 where the cured film has a dielectric constant less than 0.3, a transmittance of 400 nm of at least 90%, a transmittance of 375 nm of at least 87% and a water uptake of less than 2%.

13. A composition comprising a curable arylcyclobutene-based material comprising acid functionality and an antioxidant compound having hindered phenol functionality, wherein the antioxidant compound is present in an amount of 0.2 to 6 weight percent.

14. The composition of claim 13 wherein the curable arylcyclobutene-based material is the B-staged reaction product of acid functional benzocyclobutene monomer and divinylsiloxane-bis-benzocyclobutene monomer.

15. A composition comprising a curable arylcyclobutene-based material, an antioxidant having hindered phenol functionality and an adhesion promoter which comprises the hydrolyzed or partially hydrolyzed reaction product of an alkoxylsilane or acyloxysilane, wherein the antioxidant compound is present in an amount of 0.2 to 6 weight percent.

16. The composition of claim 13 where the hindered phenol antioxidant is selected from the group consisting of

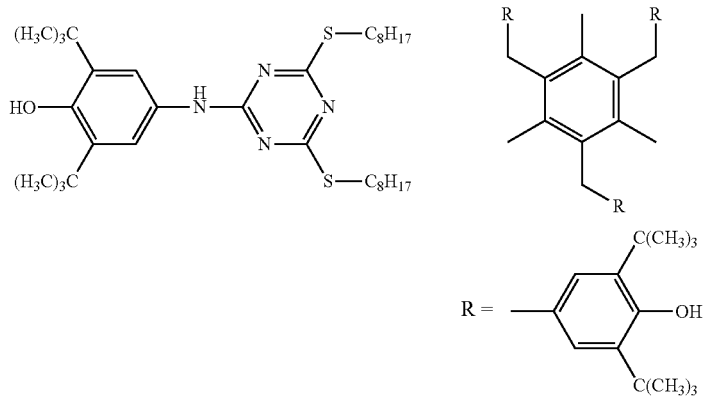

-continued

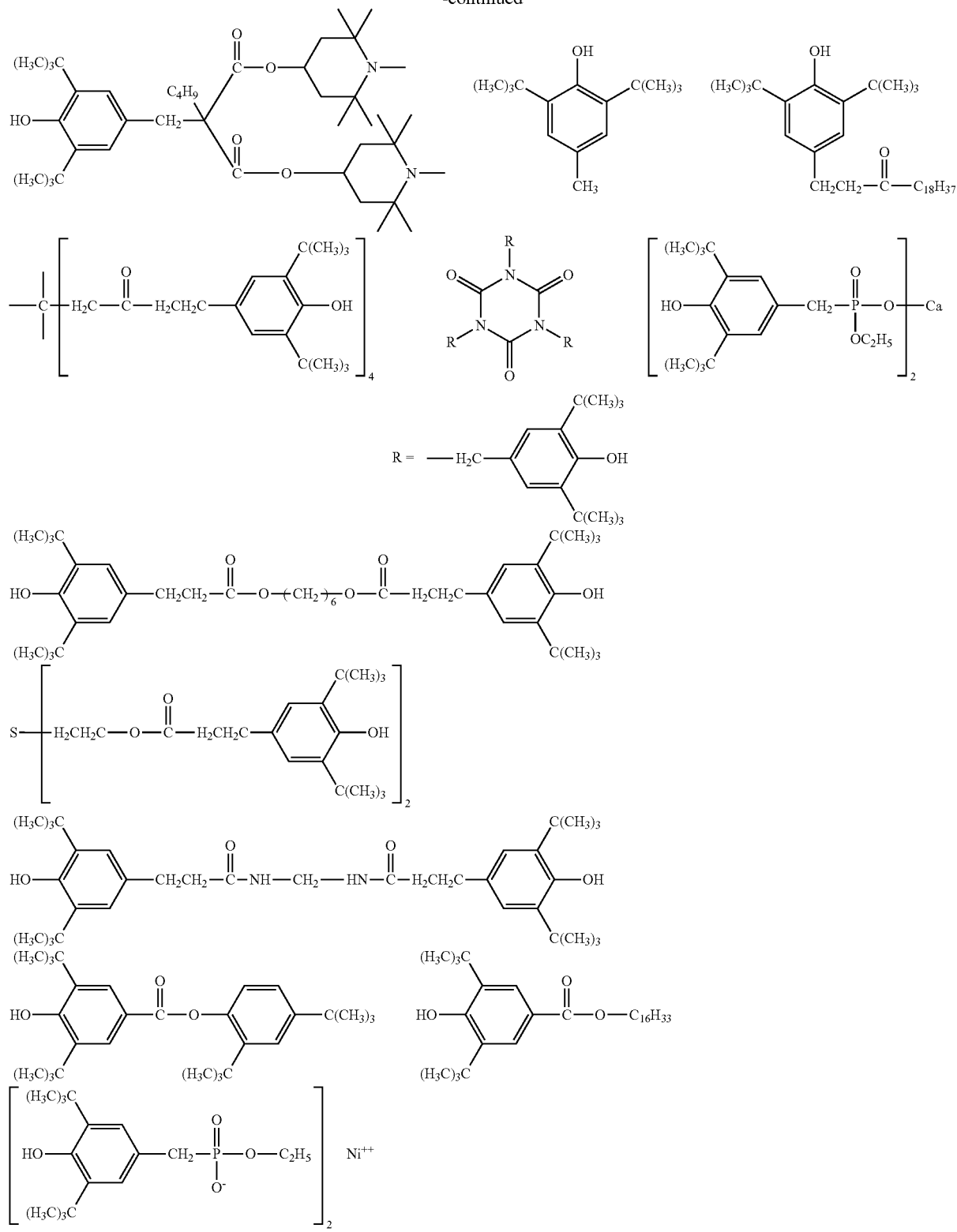

and mixtures of two or more thereof.

17. The composition of claim 13 further comprising an antioxidant which is not a hindered phenol.

18. The composition of claim 13 further comprising a photoactive compound.

19. The composition of claim 18 wherein the photoactive compound is selected from diazonaphthoquinone sulfonate esters of trihydroxybenzophenone, diazonaphthoquinone sulfonate esters of tris(hydroxyphenyl)ethane, diazonaphthoquinone sulfonate esters of mixtures of trihydroxybenzophenone, tris(hydroxyphenyl)ethane, and diazonaphthoquinone sulfonate esters of cumyl phenol.

20. The method of claim 1 where the oxidizing environment has more than 1% by volume oxygen.

21. The method of claim 20 wherein the oxidizing environment is air.

* * * * *